United States Patent
Domokos

(10) Patent No.: US 7,268,619 B2
(45) Date of Patent: Sep. 11, 2007

(54) AMPLIFIER PRE-DISTORTER METHOD AND APPARATUS

(75) Inventor: John Domokos, Salisbury (GB)

(73) Assignee: Roke Manor Research Limited, Romsey (GB)

( * ) Notice: Subject to any disclaimer, the term of this patent is extended or adjusted under 35 U.S.C. 154(b) by 127 days.

(21) Appl. No.: 10/490,054

(22) PCT Filed: Sep. 27, 2002

(86) PCT No.: PCT/GB02/04388

§ 371 (c)(1),
(2), (4) Date: Feb. 10, 2005

(87) PCT Pub. No.: WO03/030353

PCT Pub. Date: Apr. 10, 2003

(65) Prior Publication Data

US 2005/0127995 A1    Jun. 16, 2005

(30) Foreign Application Priority Data

Sep. 28, 2001 (GB) ................. 0123494.7

(51) Int. Cl.
*H03F 1/26* (2006.01)
*H04B 15/00* (2006.01)
*H04L 25/49* (2006.01)
(52) U.S. Cl. .............. 330/149; 455/63.1; 375/296
(58) Field of Classification Search .......... None
See application file for complete search history.

(56) References Cited

U.S. PATENT DOCUMENTS

| 5,049,832 | A | * | 9/1991 | Cavers | 330/149 |
| 5,105,446 | A | * | 4/1992 | Ravoalavoson et al. | 375/296 |
| 6,236,837 | B1 | * | 5/2001 | Midya | 455/63.1 |
| 6,304,140 | B1 | * | 10/2001 | Thron et al. | 330/149 |
| 6,549,067 | B1 | * | 4/2003 | Kenington | 330/52 |
| 6,580,320 | B1 | * | 6/2003 | Kenington et al. | 330/149 |
| 6,621,340 | B1 | * | 9/2003 | Perthold et al. | 330/149 |
| 6,630,862 | B1 | * | 10/2003 | Perthold et al. | 330/149 |
| 6,794,939 | B2 | * | 9/2004 | Kim et al. | 330/149 |
| 6,799,021 | B1 | * | 9/2004 | Tapio | 455/114.3 |
| 6,956,433 | B2 | * | 10/2005 | Kim et al. | 330/149 |
| 7,035,345 | B2 | * | 4/2006 | Jeckeln et al. | 375/296 |
| 7,109,792 | B2 | * | 9/2006 | Leffel | 330/149 |

FOREIGN PATENT DOCUMENTS

| EP | 0 751 614 B1 | 11/2001 |
| GB | 2 347 033 A | 8/2000 |
| GB | 2 354 126 A | 3/2001 |
| WO | WO 00 48308 A | 8/2000 |
| WO | WO 00 60732 A | 10/2000 |

* cited by examiner

*Primary Examiner*—Robert Pascal
*Assistant Examiner*—Krista M Flanagan
(74) *Attorney, Agent, or Firm*—Crowell & Moring LLP

(57) ABSTRACT

An amplifier pre-distorter method and apparatus squares an input signal and splits the signal into inphase and quadrature parts which are processed to generate a polynominal pre-distortion signal. This simplifies the apparatus and enables implementation in an application specific integrated circuit.

15 Claims, 5 Drawing Sheets

AMPLIFIER PRE-DISTORTER METHOD AND APPARATUS

This invention relates to a pre-distorter for use with an amplifier to pre-distort an input signal to compensate for non-linear performance of the amplifier.

The performance of a notional ideal power amplifier results in a straight-line relationship of input to output current or voltage. Practical power amplifiers depart from the ideal straight-line characteristics with the gain varying over the input voltage after an initial linear region. This variation will also vary with changes in the applied frequency and in particular between different orders of modulation products which are harmonics of the frequency of the applied signal. The non-linearity results in the generation of sums and differences of integer multiples of the frequencies of the input signal which is referred to as inter-modulation distortion. These inter-modulation products can cause a significant interference problem in broadband communication systems where the inter-modulation products may lie naturally within the band.

In order to alleviate these problems it is known to pre-distort the input signal applied to the power amplifier in order to compensate for the performance of the amplifier. The performance may vary in terms of amplitude and in phase. A typical pre-distortion signal will be based on a polynomial expansion hence giving rise to the name given to such a technique of polynomial pre-distortion.

GB 2335813 discloses a pre-distortion technique in which part of the input signal is directed to a second compensating signal path. This signal is split into different modulation products and each product trimmed and shifted in phase as required. The individual products are multiplied and amplified to provide a compensation signal. The compensation signal is multiplied with the rf input signal before application to a non-linear power amplifier. A problem with the disclosed arrangement is that time delay circuitry is required to compensate for the different signal path lengths to ensure that the input signal and the compensation signal arrive at the non-linear power amplifier at the same time. Since the time delay can vary according to the frequency of the products a practical implementation is very difficult. A further requirement of the disclosed design is that filtering is required to eliminate the second harmonics of the correction signal.

According to the invention there is provided a method of pre-distorting an input signal to an amplifier comprising the steps of squaring an applied input signal to obtain a polynomial pre-distortion signal and combining the pre-distortion signal with the input signal and applying the combination to the amplifier.

A specific embodiment of the invention will now be described, by way of example only, with reference to the drawing in which.

Figure 1:
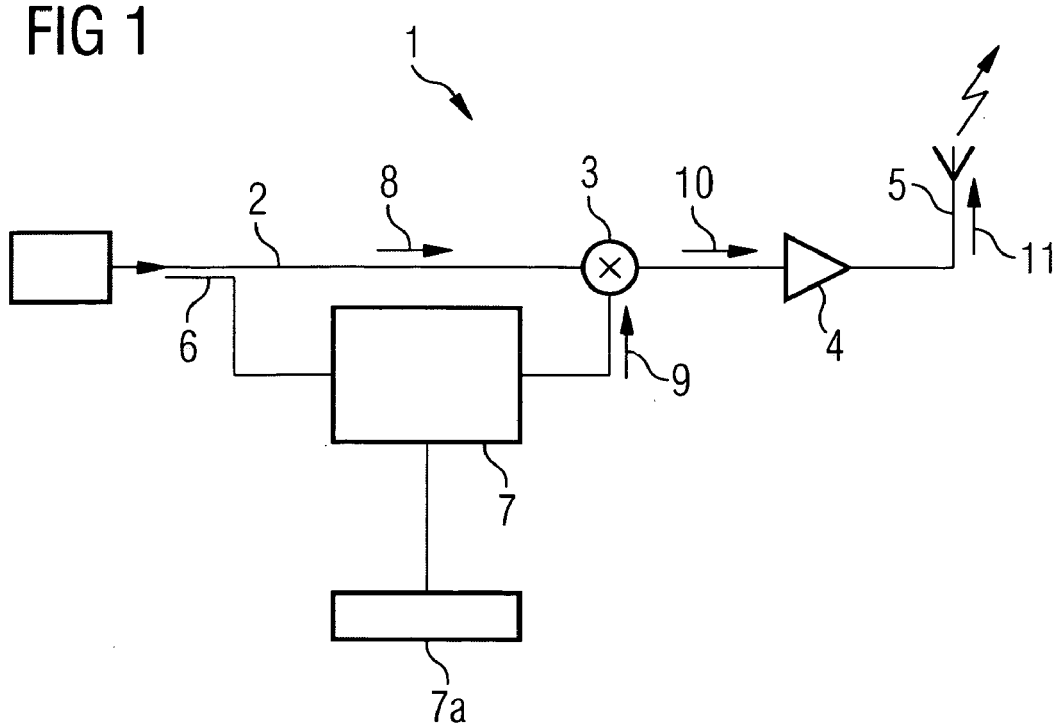
FIG. 1 shows in schematic block diagram form a polynomial pre-distorter in accordance with the invention in association with a power amplifier of a transmitter section of a broad band communication apparatus.

With reference to FIG. 1, a transmitter section 1 of a wide band communications apparatus includes an RF input 2 which receives from earlier stages a signal to be transmitted by the apparatus. The earlier stages are depicted as a box in the figure and since the form of the stages will be well known to a person skilled in the art they will not be described further. The input 2 is connected to a main signal path which includes a multiplier 3, a power amplifier 4 and an antenna 5. A part of the input signal power is coupled to a second signal path by a coupler 6. The second signal path includes a pre-distorter 7 in accordance with the invention and the earlier mentioned multiplier 3. Thus at this level an RF signal represented by arrow 8 is used to derive a polynomial pre-distortion correction signal 9. These are multiplied at the multiplier 3 to produce a predistorted RF signal which is amplified by the non-linear power amplifier 4 to produce an output signal 11 which is radiated by the antenna. The predistorter 7 is operably coupled to a memory 7a that holds parameters to be used in the predistortion process.

Figure 2:
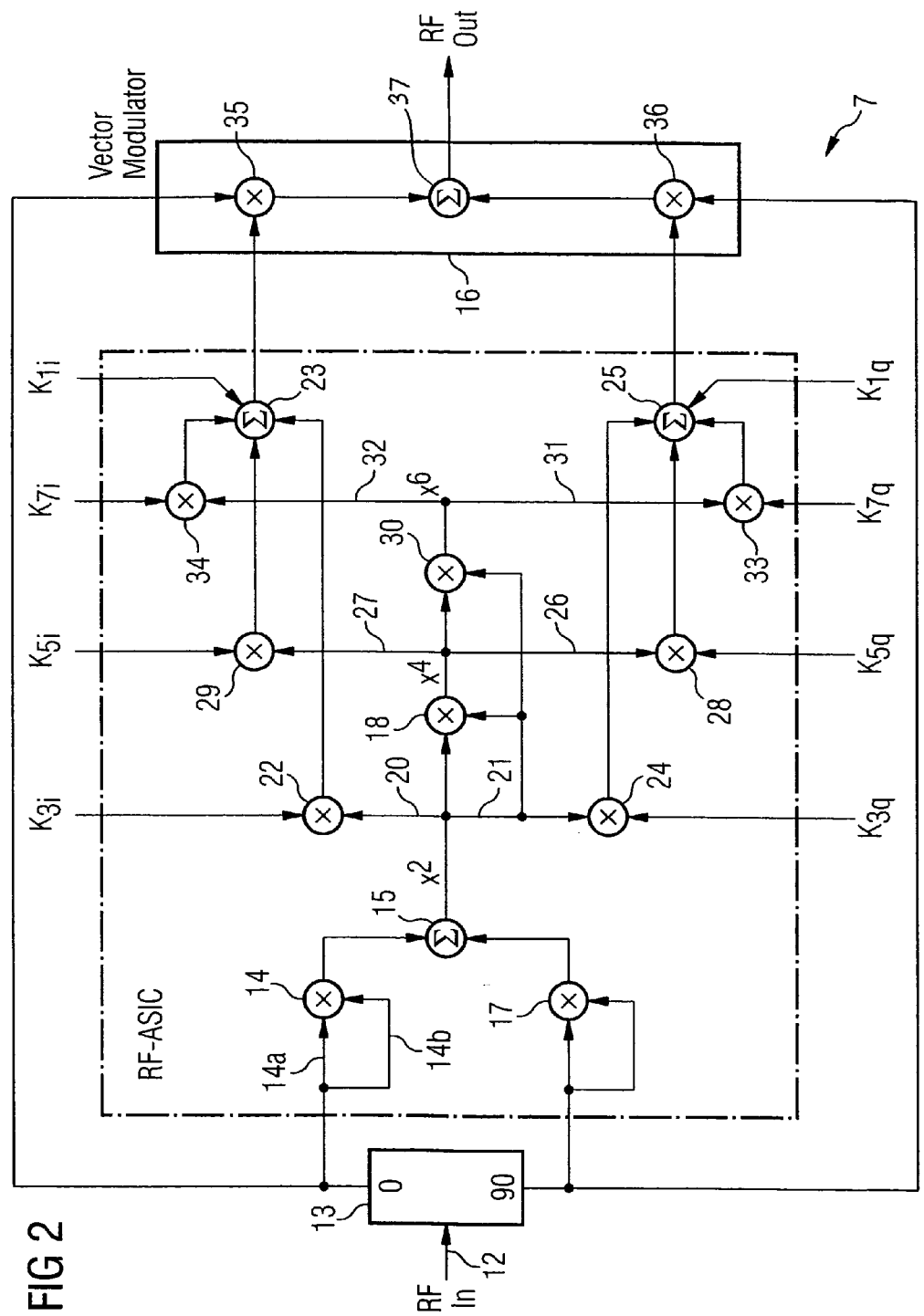
FIG. 2 shows in schematic form the predistorter of FIG. 1 in greater detail.

The predistorter 7 is shown in greater detail in FIG. 2. It is implemented on an RF-ASIC (application specific integration circuit). The RF signal coupled by the coupler 6 is passed to an input 12 of the pre-distorter 7. There they are split into inphase and quadrature signals by a hybrid splitter 13. The inphase signal is coupled a multiplier 14 however here it should be noted that the signal is split into two paths 14a and 14b and hence the signal is multiplied with itself. The inphase signal is thus squared by this multiplier 14. The squared signal is passed to a summer 15. The inphase signal is also coupled prior to the multiplier 14 to a vector modulator 16 the operation of which will be described later. The vector modulator 16 corresponds to the multiplier 3 of FIG. 1.

The quadrature signal is coupled to a second multiplier 17 again the signal is coupled to both inputs and thus the multiplier 17 provides an output which is the quadrature signal squared. The squared quadrature signal is coupled to the summer 15 which produces the magnitude $\chi^2$ term of the required polynomial pre-distortion signal. The quadrature signal is also coupled to the vector modulator 16.

The $\chi^2$ signal is coupled to both inputs of a multiplier 18 and is thus multiplied with itself to produce the $\chi^4$ term of the pre-distortion signal. The $\chi^2$ is also split into inphase and quadrature components along branches 20 and 21.

Branch 20 couples the signal to a multiplier 22 where it is multiplied with a value $K_{3i}$ obtained from memory 7a to produce as an output a signal $K_{3i}\chi^2$. The output of the multiplier 22 is coupled to a summer 23.

Branch 21 couples the signal to multiplier 24 where it is multiplied with a value $K^{3q}$ again obtained from memory 7a to produce an output $K_{3q}\chi^2$. This output is coupled to a summer 25.

The $\chi^4$ signal is split into two paths 26 and 27. Path 26 couples the signal to a multiplier 28 where it is multiplied by a value $K_{5q}$ from memory 7a to produce an output signal $K_{5q}\chi^4$. This output signal is coupled to the summer 25.

The path 27 couples the $\chi^4$ signal to the multiplier 29 where it is multiplied with a value $K_{5i}$ from memory 7a to produce an output signal $K_{5i}\chi^4$. This signal is coupled to the summer 23.

The $\chi^4$ signal is also coupled to multiplier 30 where it is multiplied by the $\chi^2$ signal coupled from the branch 21. This provides an output signal $\chi^6$ which is coupled by branches 31 and 32 to multipliers 33 and 34. At multiplier 33 the $\chi^6$ signal is multiplied with a value $K_{7q}$ from memory 7a to produce an output signal $K_{7q}\chi^6$ which is coupled to the summer 25. Whilst at multiplier 34 the $\chi^6$ signal is multiplied with a value $K_{7i}$ form memory 7a to produce an output signal $K_{7i}\chi^6$ which is coupled to the summer 23.

A further signal $K_{1i}$ from memory 7a is applied to the summer 23 and a further signal $K_{1q}$ form the memory 7a applied to summer 25.

Thus it will be understood that the summer 23 will produce the polynomial expression $K_{1i}+K_{3i}\chi^2+K_{5i}\chi^4+K_{7i}\chi^6$. This is output to a multiplier 35 in the vector modulator 16 where it is multiplied by the inphase signal $\chi$ to produce an output signal $\chi(K_{1i}+K_{3i}\chi^2+K_{5i}\chi^4+K_{7i}\chi^6)$ which is coupled to a summer 37.

The summer 25 will similarly produce the polynomial expression $K_{1q}+K_{3q}\chi^2+K_{5q}\chi^4+K_{7q}\chi^6$ which is output to a multiplier 36 in the vector modulator 16 where it is multiplied by a quadrature signal $\chi$ from the splitter 13 to produce an output signal of the form $\chi(K_{1q}+K_{3q}\chi^2+K_{5q}\chi^4+K_{7q}\chi^6)$ which is coupled to the summer 37.

The summer 37 outputs the combined inphase and quadrature signals to produce the pre-distorted signal $\chi(K_1+K_3\chi^2+K_5\chi^4+K_7\chi^6)$ which is applied to the power amplifier 4.

Figure 3:
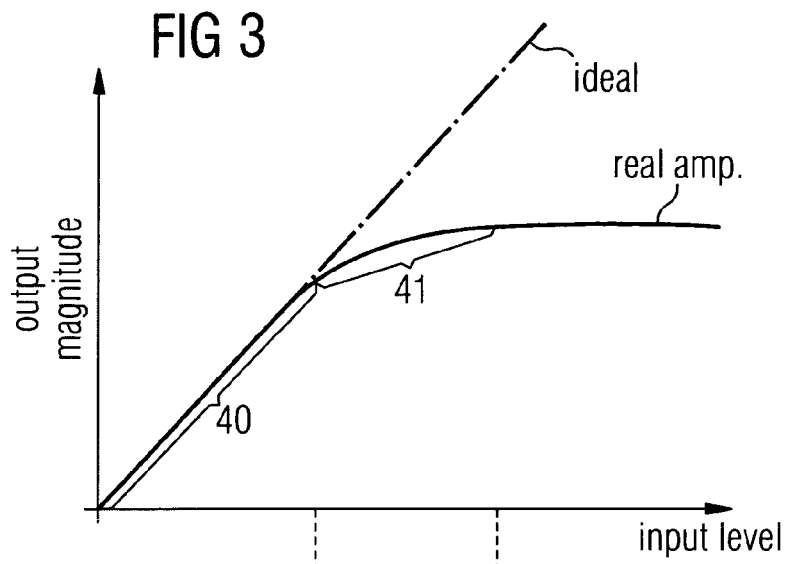
FIGS. 3 to 9 are explanatory diagrams.

The way in which the predistortion caters for the power amplifier performance will now be described with reference to FIGS. 3 to 9. As is shown in FIG. 3 when the magnitude of an output signal produced by a power amplifier is compared with the input signal level a characteristic is obtained which is linear over an initial region 40 but then departs in a curve region 41 before saturation of the amplifier is reached when an increase in input power no longer leads to a useful increase in the output power level. The ideal amplifier characteristic is shown as a broken line which projects with the same gradient as the linear region 40. The task of the pre-distortion will be to anticipate the amplifier characteristic to compensate for the tail-off in performance over region 41.

Figure 4:
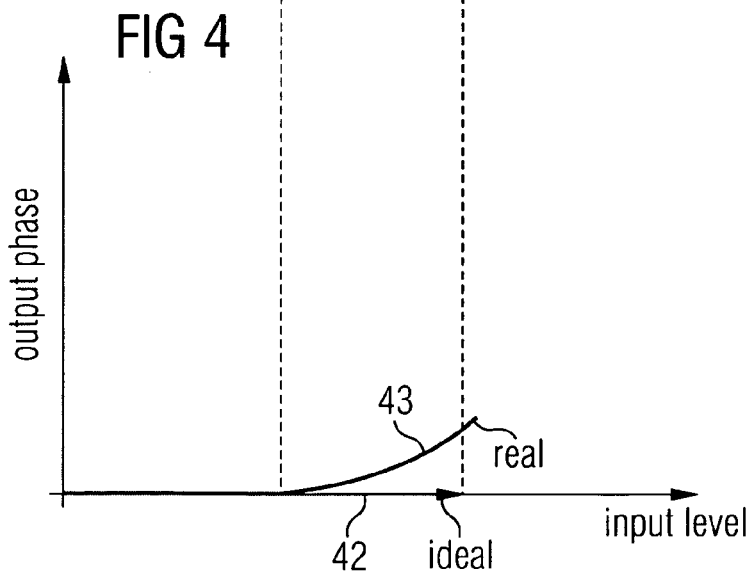
Figure 5:
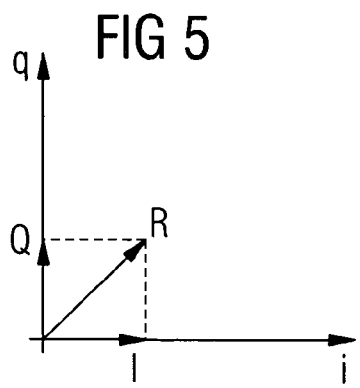

FIG. 4 shows the way in which a real amplifier's performance in terms of phase varies from the ideal. The y axis represents the output phase and the x axis represents the input signal level. For the ideal power amplifier there will be no difference between the phase of the input and the phase of the output signals. Thus, for the ideal amplifier the plot would lie on the x axis as represented by arrowed line 42. However, for a real amplifier the performance will vary over the input power levels. Typically, as the input power increases the phase difference at the output will increase in the manner of plot 43. With a knowledge of this performance the predistortion signal is arrange to reduce the phase difference. The way in which the phase is controlled involves the application of the values K. For the inphase and quadrature branch the values are varied to give a resultant phase when the signals are combined that provides the required pre-distortion. This is broadly depicted in FIG. 5 where a quadrature signal Q is combined with an inphase signal I to give a resultant signal R. By varying Q and I it is possible for R to lie on any plane in 360 degrees.

FIGS. 6 to 9 show the way in which a signal is predistorted by the value $K_{3i}\chi^2$.

Figure 6:
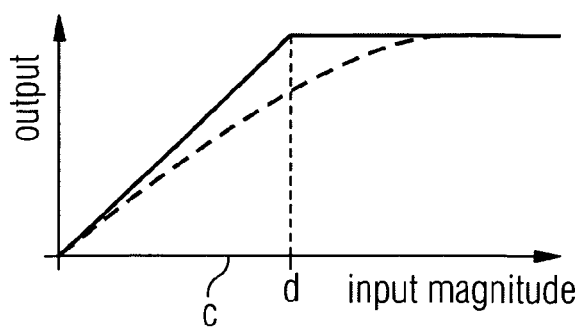
Figure 7:
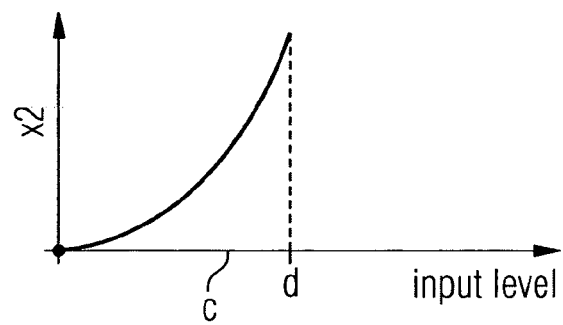

FIG. 6 shows how an amplifier characteristic shown in broken outline varies in terms of output magnitude on the y axis against applied input power on the x axis. The desired characteristic is shown as a solid line. It will be seen that as the applied input power level approaches d the characteristic curves downwards. Consideration should be given to the $\chi^2$ signal plotted in FIG. 7. Being a square function it is centre on zero and its gradient increases as the input power level is increased. Thus its magnitude at d is far greater than at a lower level c. This matches well with the correction required in FIG. 6 since at an input level c the real amplifier performance is close to ideal whereas the departure from ideal at level d is greater.

Figure 8:
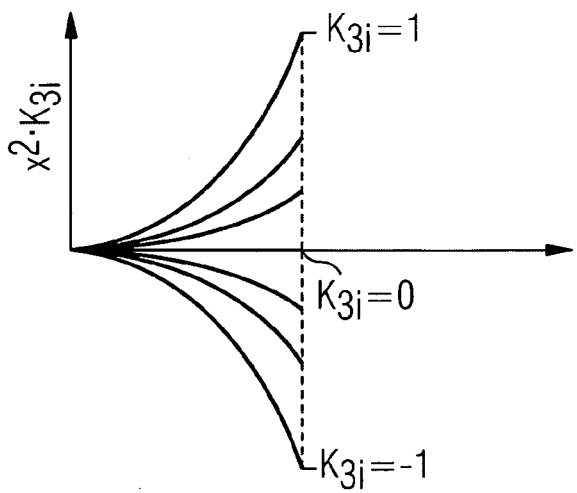
Figure 9:
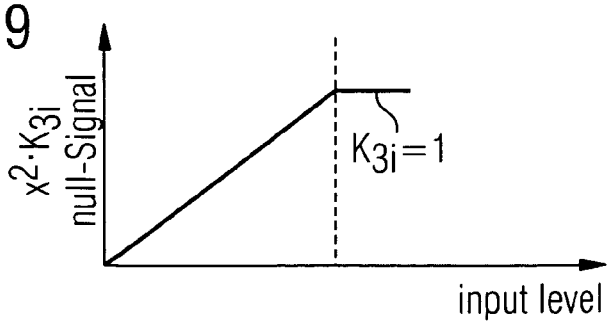

FIG. 8 shows a plot of the function $K_{3i}\chi^2$ for values of $K_{3i}$ between 1 and −1. It will be seen that by using a value of 1 and combining the predistortion to the signal a plot as shown in FIG. 9 is produced which is close to the desired performance.

It will be appreciated that the other parts of the polynomial predistortion expression can provide greater refinements to the correction process.

The values for K in the aforementioned embodiment are set during manufacture of the equipment with a knowledge of the performance characteristics of the amplifier and stored in the memory 7a.

Figure 10:
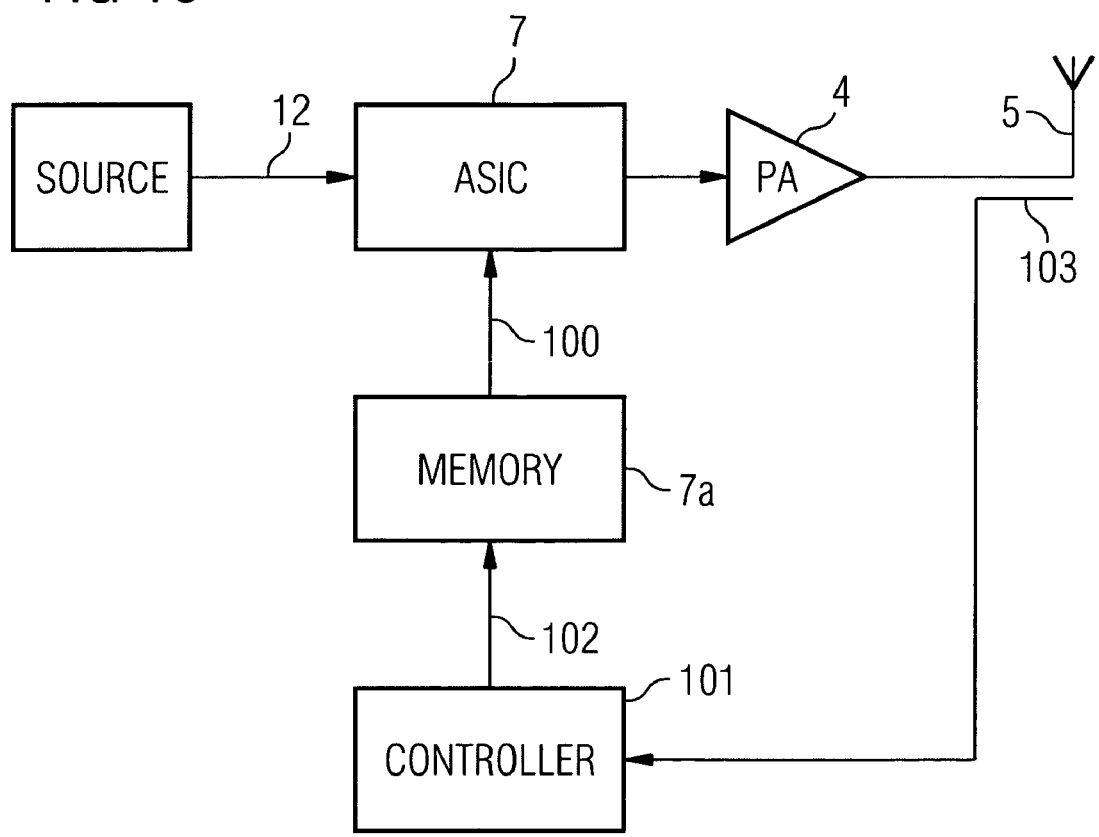
FIG. 10 is a block diagram of an alternative embodiment of the invention.

In an alternative embodiment of the invention an adaptive control is provided to vary the stored parameters in order to cater for changes in component performance due to environmental changes for example temperature variation or component ageing. As is shown in FIG. 10, the source of the radio frequency radiation couples the rf signal to the asic 7 which includes the components illustrated in FIG. 2. The output of the asic is coupled to the power amplifier 4 and hence after amplification to the antenna 5. The output of the asic is the rf signal predistorted to cater of the characteristics of the power amplifier 4 as in the earlier described embodiment. The values for K to be used in the predistortion are held in a memory 7a as before linked by a bus 100 to the asic 7. However, a controller 101 (a suitably programmed microprocessor) is arranged to update the values via a data bus 102

The invention claimed is:

1. A method of pre-distorting an RF input signal to an amplifier, said method comprising:
   squaring said RF input signal to obtain a polynomial pre-distortion signal;
   combining the polynomial pre-distortion signal with the input signal to form a combination; and
   applying the combination to the amplifier; wherein
   the polynomial pre-distortion signal is combined with the input signal by a step of multiplying the signals together to produce a combined output signal to be applied to the amplifier;
   the input signal is split into inphase and quadrature signals and processed to produce inphase and quadrature polynomial pre-distortion signals which are combined to form the polynomial pre-distortion signal.

2. A method as claimed in claim 1, wherein the squared input signal is used to generate even powers of a polynomial pre-distortion signal.

3. A method as claimed in claim 2, wherein the input signal is squared by multiplying the signal by itself.

4. Apparatus for pre-distorting an RF input signal input to an amplifier, said apparatus comprising:
   an RF input for receiving an RF signal to be pre-distorted;
   a squarer for squaring the input signal to obtain a polynomial pre-distortion signal; and
   a signal splitter for splitting the input signal into inphase and quadrature signals and inputting the inphase and quadrature signals into the squarer;
   wherein the squarer comprises at least one multiplier for multiplying the input signal by itself, to create a squared signal.

5. A pre-distorter as claimed in claim 4, wherein the squarer comprises a multiplier for each of the inphase and quadrature signals.

6. A pre-distorter as claimed in claim 5, wherein each multiplier has an output operably coupled to a summer which sums the squared inphase and quadrature signals.

7. A pre-distorter as claimed in claim 6, wherein the summed signal is applied to both inputs of a multiplier to generate a signal to the power four.

8. A pre-distorter as claimed in claim 7, comprising a further multiplier to which the squared signal and the signal to the power four are applied to generate a signal to the power six.

9. A pre-distorter as claimed in claim 8, comprising at least one further multiplier for further multiplying the signal from previous multipliers to generate a further signal.

10. A pre-distorter as claimed in claim 9, wherein the further signal is one of an inphase signal and a quadrature signal.

11. A pre-distorter as claimed in claim 10, comprising an inphase branch for multiplying the signal with inphase signals, and a quadrature signal branch for multiplying the signal with quadrature signals.

12. A pre-distorter as claimed in claim 11, wherein the inphase branch and the quadrature branch both have a summer to combine the multiplied signals.

13. A pre-distorter as claimed in claim 12, wherein the combined multiplied signals are input to a vector modulator.

14. A pre-distorter as claimed in claim 13, wherein the vector modulator further comprises a multiplier for multiplying the combined multiplied signals with the input signal and a summer for combining the inphase and quadrature signals to provide a pre-distortion signal to be applied to the amplifier.

15. Radio communications apparatus comprising a signal predistorter as claimed in claim 4, operably coupled to a power amplifier to provide a predistorted signal thereto.

* * * * *